United States Patent
Shiralagi et al.

[11] Patent Number: 5,756,154
[45] Date of Patent: May 26, 1998

[54] MASKING METHODS DURING SEMICONDUCTOR DEVICE FABRICATION

[75] Inventors: Kumar Shiralagi, Chandler; Raymond Tsui, Phoenix; Herbert Goronkin, Tempe, all of Ariz.

[73] Assignee: Motorola, Inc., Schaumburg, Ill.

[21] Appl. No.: 583,329

[22] Filed: Jan. 5, 1996

[51] Int. Cl.$^6$ .............................. B05D 1/32; B05D 3/00; C08J 7/18
[52] U.S. Cl. .......................... 427/272; 427/282; 427/399; 427/553; 427/558; 427/583; 427/586
[58] Field of Search ........................... 427/272, 282, 427/399, 583, 553, 558, 586

[56] References Cited

U.S. PATENT DOCUMENTS

| | | | |
|---|---|---|---|
| 4,575,919 | 3/1986 | Logan et al. | 29/569 L |
| 4,702,936 | 10/1987 | Maeda et al. | 427/54.1 |
| 5,298,456 | 3/1994 | Unozawa | 437/126 |
| 5,308,788 | 5/1994 | Fitch et al. | 437/81 |
| 5,412,246 | 5/1995 | Dobuzinsky et al. | 257/632 |
| 5,451,425 | 9/1995 | Vig | 427/8 |

OTHER PUBLICATIONS

"Resistless high resolution optical lithography on silicon" by N. Kramer, M. Niesten and C. Schonenberger from Appl. Phys. Lett.67 (20), 13 Nov. 1995.

*Primary Examiner*—Shrive Beck
*Assistant Examiner*—Michael Barr
*Attorney, Agent, or Firm*—Eugene A. Parsons

[57] ABSTRACT

A method of masking surfaces during fabrication of semiconductor devices is disclosed, which includes providing a substrate, and in a preferred embodiment a silicon substrate. The surface is hydrogen terminated (or hydrogenated) and a metal mask is positioned on the surface so as to define a growth area and an unmasked portion on the surface. Ozone is generated at the surface, at least in the unmasked area, by exposing the surface to a light having a wavelength approximately 185 nm (an oxygen absorbing peak), so as to grow an oxide film on the unmasked portion of the surface. The metal mask is removed and the oxide film then serves as a mask for further operations and can be easily removed in situ by heating.

20 Claims, 1 Drawing Sheet

MASKING METHODS DURING SEMICONDUCTOR DEVICE FABRICATION

FIELD OF THE INVENTION

The present invention pertains to the fabrication of semiconductor devices and more specifically to improved masking techniques during semiconductor device fabrication.

BACKGROUND OF THE INVENTION

In the semiconductor field it is common to sequentially grow several different layers of semiconductor material and use various masks and etching steps to form the desired devices and terminals on the devices. In some methods, masking material, e.g. photoresist or the like, is applied and semiconductor material is grown over masked and unmasked areas. The material on the masked areas is then removed by etching and lift-off. In some instances material is selectively grown in unmasked areas and the masking material is then removed. In some processes a photoresist mask is used to define and develop a hard mask, i.e. a metal mask, a nitride mask, etc.

Generally, in these prior art methods of fabricating semiconductor devices, etching is required to remove unwanted material and masks are removed by etching, solvent, or the like. During the etching and/or mask removal processes, the material of the semiconductor device has a high likelihood of being contaminated by the etchant, which contamination greatly reduces the life of the device, the operating characteristics of the device, and the reliability of the device. Further, the etching process severely damages semiconductor material adjacent the etched areas which further reduces life, operating characteristics, and reliability. Also, etching processes are very time consuming and difficult to perform.

Thus, these prior art techniques involve many process steps such as resist spinning, exposure, developing, cleaning and so on. All of these processes can introduce contamination, decrease yield, etc. A further problem that arises is that the structure or substrate (generally a wafer) must be removed from the growth chamber to remove the masking material. The structure is then masked again and reintroduced into the growth chamber for re-growth. Thus, the prior art techniques keep the wafer vacuum incompatible.

In addition to the masking and etching problems, all known prior art fabrication processes require many interspersed growing, masking and etching steps which greatly complicate and lengthen the process. For example, when epitaxial layers are grown, the wafers must be placed in a vacuum or pressure chamber to provide the atmosphere for the growth. Each time the wafer must be etched and/or masked, it must be removed from the chamber, resulting in large amounts of preparation time for each step. Also, each time wafers are removed from a chamber and subsequently replaced, the opening and preparation of the chamber (as well as the processing of the wafer) is an opportunity for additional impurities and contaminants to be introduced to the wafer.

Accordingly, it would be highly desirable to provide fabrication methods for semiconductor devices with improved masking processes.

It is a purpose of the present invention to provide a new and improved method of masking substrates during semiconductor device fabrication.

It is another purpose of the present invention to provide a new and improved method of masking substrates during the fabrication of semiconductor devices which does not require removal of the substrate from the processing chamber to remove the mask.

It is still another purpose of the present invention to provide a new and improved method of masking substrates during the fabrication of semiconductor devices which does not require the introduction of contaminants, such as photoresist, solvents and etchants.

It is a further purpose of the present invention to provide a new and improved method of masking substrates during the fabrication of semiconductor devices which is much simpler and includes less chance of contamination of the devices.

SUMMARY OF THE INVENTION

The above problems and others are at least partially solved and the above purposes and others are realized in a method of masking surfaces during fabrication of semiconductor devices which includes providing a substrate with a passivated surface, such as a hydrogen terminated (or hydrogenated) surface. A mask, similar to masks used in semiconductor manufacturing, is positioned on the surface so as to define a growth area and an unmasked portion on the surface. In the unmasked area, by exposing the surface to a light, an oxide film is grown on the unmasked portion of the surface. The oxide film replaces the hydrogen termination in the unmasked portion. The mask is removed and the oxide film then serves as a mask for further operations such as etching, regrowth, etc. During regrowth, for example, the oxide film mask can be easily removed in situ by heating if necessary.

In a preferred embodiment, the substrate is silicon. Also, the mask positioned on the surface is a hard mask, such as a metal mask or the like. Further, in the preferred embodiment the light used has a wavelength approximately 185 nm (an ozone forming peak).

As a specific example, the substrate is then introduced into a growth chamber and may be heated to drive off the hydrogen in the exposed growth area. A crystalline material is selectively grown on the exposed growth area and the substrate is heated to desorb the oxide layer in the growth chamber. Thus, semiconductor devices are grown and the mask is removed without taking the substrate from the growth chamber.

BRIEF DESCRIPTION OF THE DRAWINGS

Referring to the drawings.

DESCRIPTION OF THE PREFERRED EMBODIMENTS

Figure 1:
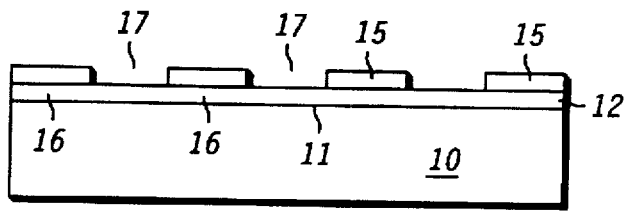
FIGS. 1, 2, 3, and 4 are simplified sectional views of a substrate illustrating several sequential steps in a masking process in accordance with the present invention.

Turning now to the drawings, FIGS. 1–4 illustrate several steps in a method of masking a substrate 10, in accordance with the present invention, for the fabrication of semiconductor devices. Referring specifically to FIG. 1, a simplified sectional view of substrate 10 having a surface 11 is illustrated. In this specific embodiment, substrate 10 is formed of silicon (Si), but it will be understood by those skilled in the art that other materials known in the art might be utilized. Also, it should be understood that substrate 10 might simply be a supporting structure, such as a wafer or the like, or it might include various layers formed on or in the supporting structure.

Surface 11 of substrate 10 is hydrogenated at 12 (hydrogen terminated or passivated), by methods well known in the art, to prevent instantaneous oxidation of surface 11. The hydrogen termination process generally replaces, or prevents the formation of, a film of natural oxide on surface 11. While the hydrogenated surface is represented by a film 12 for purposes of this explanation, it will be understood by those skilled in the art that this may be no more than hydrogen atoms completing the crystalline structure of substrate 10 at surface 11. The manner in which hydrogen terminates the crystalline material of substrate 10 is explained in detail in a copending application entitled "An Enhanced Electron Emitter", Ser. No. 08/011,595, filed Feb. 1, 1993, now U.S. Pat. No. 5,619,092 and assigned to the same assignee. In some applications other types of passivation may be used, or the hydrogenation may not be required, and it has been found that the present technique will operate generally as described with the surface simply being clean (i.e. no foreign matter).

A mask 15 is positioned adjacent to surface 11 of substrate 10 for patterning surface 11, as will be explained presently. Mask 15 generally is a shadow or metal mask but, in some special applications, it can be formed in the well known manner with photolithography. As will become apparent presently, one of the major advantages of the present technique is that photolithography and the like are not necessary for the described masking operations. In a preferred embodiment, mask 15 is a mask plate with metal lines, for example, a chrome mask. In any case, mask 15 is positioned adjacent surface 11 so as to define one or more growth areas 16 on surface 11 beneath mask 15 and one or more unmasked portions 17 on surface 11 of substrate 10.

Figure 2:
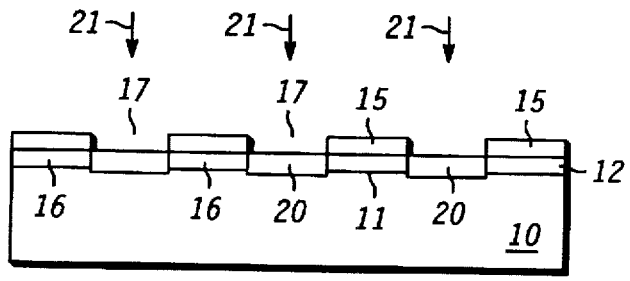

Unmasked portions 17 of surface 11 are exposed to light, represented by arrows 21 in FIG. 2, that can replace the passivation and grow an oxide film. In the present specific example, using hydrogen termination, it is believed that the light generates ozone due to optical excitation. The excitation wavelength that is most suitable for efficient ozone generation is also the most efficient to use. In a more specific example, the light includes a wavelength of approximately 185 nm, which is where an oxygen absorption peak exists. The ozone reacts with surface 11, replacing the hydrogen termination (12) with an oxide film 20. The exposure to light can be performed under a lamp. However, when the light is collimated, as in an aligner or stepper, sharp features can be defined in unmasked portion 17.

In a specific example, a silicon wafer with a hydrogen terminated surface was provided. A UV Ozone cleaner was used at approximately 20 mW/cm$^2$ of power with the wafer being exposed through a chrome coated mask for 5 minutes. An oxide film with a thickness less than approximately 2 nm was produced in the unmasked areas.

Figure 3:
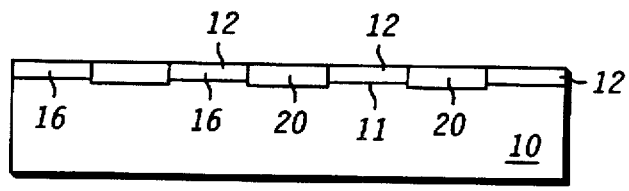
Figure 4:
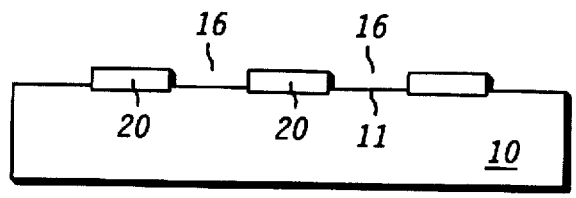

Once oxide film 20 is grown, mask 15 is removed to expose growth areas 16, as illustrated in FIG. 3. Oxide film 20 then serves as a mask for further operations and can be easily removed in situ by heating. As an example of further operations, substrate 10 is then introduced into a growth chamber (not shown) and heated to remove any hydrogen that may still be present in growth areas 16. Here it should be noted that the prior disclosed steps of providing a substrate, hydrogen terminating the surface of the substrate, positioning the mask adjacent the surface, exposing the unmasked portion to light, and removing the mask are all performed outside of the growth chamber and at room temperature. It will of course be understood that the hydrogen termination (12) is very transient and will disappear by itself in a very short time (e.g. a few hours). Substrate 10 with oxide-free growth areas 16 is illustrated in FIG. 4.

Figure 5:
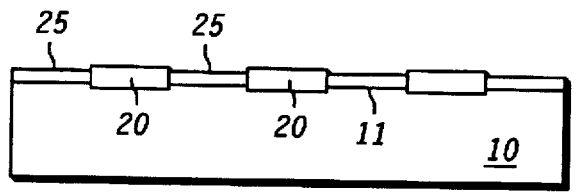
FIG. 5 is a simplified sectional view of the substrate of FIG. 4 with semiconductor material grown on the surface.

While retaining substrate 10 in the growth chamber, selective growth of crystalline, or semiconductor, material 25 in growth areas 16 is performed, as illustrated in FIG. 5. With oxide film 20 in place as a mask for further growth, a predetermined amount of crystalline material 25 is selectively grown in area (or areas) 16. For purposes of this disclosure, "selective growth" or "selectively grown" is defined as growing only in the specific or designated area. Thus, in this example, material 25 grows only in growth areas 16. Further, material 25 generally grows in a crystalline form so that growth rates and shapes are crystallographic dependent, i.e. the rate and shape of growth are dependent upon the type of material 25 being utilized.

Figure 6:
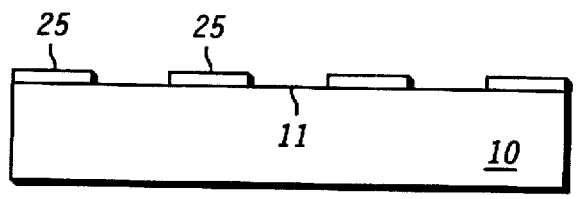
FIG. 6 is a simplified sectional view of the substrate with the mask removed.

Once the desired amount of material 25 is grown in growth areas 16, substrate 10 is heated to a higher temperature in the growth chamber to desorb oxide film 20, resulting in the structure illustrated in FIG. 6. Thus, the mask utilized for patterned growth of material 25 is desorbed, or removed, in situ, i.e. without the need to remove substrate 10 from the growth chamber.

Figure 7:
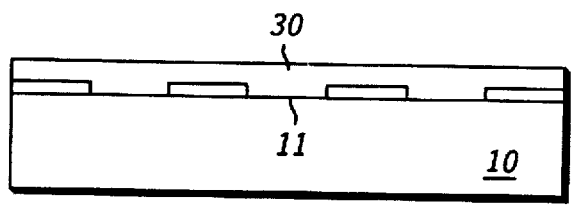
FIG. 7 is a simplified sectional view of the substrate illustrating additional material deposited thereon.

Further growth of material can be performed on crystalline material 25 subsequent to the step of heating substrate 10 to desorb oxide film 20. As illustrated in FIG. 7, a layer 30 of additional material is grown or deposited on the surface of material 25 and on the exposed surface of substrate 10. Thus, re-growth is performed without having to remove substrate 10 from the growth chamber. It will be apparent to those skilled in the art, after reading this disclosure, that complete semiconductor devices can be formed on substrate 10 without removing it from the growth chamber.

It should also be understood that oxide film 20 can be incorporated into and retained as a portion of some types of semiconductor devices. For example, oxide film 20 can be used as a gate oxide in some insulated gate field effect transistors. In which case oxide film 20 is grown as described above and is then masked to define the gate area, after which a metal layer is formed thereon to define the gate electrode.

Thus, an improved masking processes is disclosed which provides a new and improved method of masking substrates during semiconductor device fabrication. The new and improved method of masking substrates includes a simplified method of masking silicon without requiring photoresists and the like. The absence of resist in the process improves resolution limits previously defined by resist thickness. Further, the new process eliminates a number of process steps and, hence, is cheaper, cleaner, improves yield, can result in better resolution and therefore smaller lines, and makes the fabrication process vacuum compatible. Because the new and improved method of masking substrates does not require the introduction and removal of wafers or substrates from processing chambers several times in sequence during the fabrication of semiconductor devices, the fabrication process is much simpler and includes less chance of contamination of the devices. The present novel process allows selective growth and further re-growth, all in-situ, without exposure to air and contamination during the intermediate processing steps between epitaxy, etc. By eliminating air and other contaminant exposure between steps, the novel process ensures good quality in subsequent epitaxial steps.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of masking surfaces during fabrication of semiconductor devices comprising the steps of:

providing a substrate with a surface and having a passivating film on the surface;

positioning a mask adjacent to the passivating film so as to define a growth area and an unmasked portion on the passivation film and the surface;

directing light onto the unmasked portion of the passivation film and the surface to remove the passivating film and simultaneously generate ozone at the surface so as to grow an oxide film on the unmasked portion of the surface, the step of directing light being performed at room temperature; and removing the mask.

2. A method of masking surfaces during fabrication of semiconductor devices comprising the steps of:

providing a substrate with a clean, oxide-free surface;

positioning a mask adjacent the surface so as to define a growth area and an unmasked portion on the surface;

generating ozone at the surface in the unmasked area so as to grow an oxide film on the unmasked portion of the surface, the step of generating ozone being performed at ambient or room temperature; and removing the mask.

3. A method of masking surfaces during fabrication of semiconductor devices as claimed in claim 2 wherein the step of providing the substrate includes providing a silicon substrate.

4. A method of masking surfaces during fabrication of semiconductor devices as claimed in claim 3 wherein the step of providing a substrate with a surface includes providing a substrate with a hydrogen passivated surface and the step of generating ozone at the surface in the unmasked area replaces hydrogen with an oxide film on the unmasked portion of the surface.

5. A method of masking surfaces during fabrication of semiconductor devices as claimed in claim 2 wherein the step of positioning the mask adjacent the surface includes utilizing a mask plate with metal lines.

6. A method of masking surfaces during fabrication of semiconductor devices as claimed in claim 5 wherein the step of utilizing the mask plate with metal lines includes utilizing a chrome mask.

7. A method of masking surfaces during fabrication of semiconductor devices as claimed in claim 2 wherein the step of generating ozone at the surface includes directing light onto the surface from a light source with a wavelength approximately at an oxygen absorption peak.

8. A method of masking surfaces during fabrication of semiconductor devices as claimed in claim 7 wherein the step of generating ozone at the surface includes directing light onto the surface from a light source with a wavelength approximately 185 nm.

9. A method of masking surfaces during fabrication of semiconductor devices as claimed in claim 8 wherein the step of generating ozone at the surface includes directing light onto the surface from a light source with approximately 20 mW/cm$^2$ of power.

10. A method of masking surfaces during fabrication of semiconductor devices as claimed in claim 2 wherein the step of generating ozone at the surface in the unmasked area so as to grow an oxide film on the unmasked portion of the surface includes growing the oxide film with a thickness less than 2 nm.

11. A method of masking surfaces during fabrication of semiconductor devices comprising the steps of:

providing a substrate with a hydrogen passivated surface;

positioning a mask adjacent the surface so as to define a growth area and an unmasked portion on the surface;

exposing the unmasked portion on the surface to a light to generate ozone at the surface so as to replace hydrogen with an oxide film on the unmasked portion of the surface, the step of exposing being performed at room temperature; and removing the mask.

12. A method of masking surfaces during fabrication of semiconductor devices as claimed in claim 11 wherein the step of providing the substrate with the surface includes providing a silicon substrate.

13. A method of masking surfaces during fabrication of semiconductor devices as claimed in claim 12 wherein the step of positioning the mask adjacent the surface includes utilizing a mask plate with metal lines.

14. A method of masking surfaces during fabrication of semiconductor devices as claimed in claim 13 wherein the step of utilizing the mask plate with metal lines includes utilizing a chrome mask.

15. A method of masking surfaces during fabrication of semiconductor devices as claimed in claim 11 wherein the step of exposing the unmasked portion on the surface to a light includes directing light onto the surface from a light source with a wavelength approximately at an oxygen absorption peak.

16. A method of masking surfaces during fabrication of semiconductor devices as claimed in claim 15 wherein the step of directing light onto the surface from the light source includes directing light onto the surface from a light source with a wavelength approximately 185 nm.

17. A method of masking surfaces during fabrication of semiconductor devices as claimed in claim 16 wherein the step of directing light onto the surface from the light source includes directing light onto the surface from a light source with approximately 20 mW/cm$^2$ of power.

18. A method of masking surfaces during fabrication of semiconductor devices as claimed in claim 11 wherein the step of exposing the unmasked portion on the surface to a light so as to replace hydrogen with the oxide film on the unmasked portion of the surface includes growing the oxide film with a thickness less than 2 nm.

19. A method of masking surfaces during fabrication of semiconductor devices comprising the steps of:

providing a substrate with a surface;

hydrogen terminating the surface;

positioning a mask on the surface so as to define a growth area and an unmasked portion on the surface;

generating ozone at the surface in the unmasked portion so as to remove the hydrogen terminating the surface on the unmasked portion and grow an oxide film on the unmasked portion of the surface, the step of generating ozone being performed at room temperature;

removing the mask to expose the growth area;

introducing the substrate with the oxide film on the unmasked portion of the surface into a growth chamber and selectively growing, on the exposed growth area, a crystalline material; and heating the substrate in the growth chamber to desorb the oxide film subsequent to the step of selectively growing.

20. A method of masking surfaces during fabrication of semiconductor devices as claimed in claim 19 wherein the step of providing the substrate with the surface includes providing a silicon substrate.

* * * * *